United States Patent [19]

Fujiwara et al.

[11] Patent Number: 5,227,364
[45] Date of Patent: Jul. 13, 1993

[54] METHOD OF FORMING PATTERNED OXIDE SUPERCONDUCTING FILMS AND JOSEPHSON JUNCTION DEVICES BY USING AN AQUEOUS ALKALINE SOLUTION

[75] Inventors: Shuji Fujiwara; Ryokan Yuasa; Masao Nakao; Masaaki Nemoto, all of Tsukuba, Japan

[73] Assignee: Sanyo Electric Co., Ltd., Osaka, Japan

[21] Appl. No.: 722,009

[22] Filed: Jun. 27, 1991

[30] Foreign Application Priority Data

Jun. 29, 1990 [JP] Japan .................................. 2-173406

[51] Int. Cl.$^5$ .......................... B05D 5/12; B05D 3/06
[52] U.S. Cl. ........................................ 505/1; 505/702; 505/728; 427/63; 427/526; 427/529; 257/31
[58] Field of Search .................. 505/1, 702, 728; 427/62, 63, 38, 526, 529; 156/637; 357/5

[56] References Cited

U.S. PATENT DOCUMENTS 5,039,656  8/1991  Hidaka ................................ 505/1
5,053,383  10/1991 Short et al. ........................ 505/1

OTHER PUBLICATIONS

Fujiwara et al, "Ion bombardment enhanced etching for Bi—Ca—Sr—Cu—O high-Tc Superconducting thin films," Jpn. Appl. Phys. 29(10) Oct. 1990 pp. 2307-2311.
Yuasa et al, "Long-range Josephson coupling in planar SNS Junctions," M²S-HTSC III Jul. 22-26, 1991, Kanazawa Japan, p1-p2.
Tsuge et al, "Microfabrication Processes for high-Tc superconducting films," IEEE Transaction on Components, hybrids and manufacturing technology vol. 12, No. 4, Dec. 1989 pp. 548-552.
Matsui et al, "Focused ion beam processes for high-Tc superconductors", J. Vac. Sci. Technol. B6(3) May/-Jun. 1988 pp. 900-905.
Matsui et al, "Radiation damage effects in ion-implanted Bi—Sr—Ca—Cu—O superconducting thin films", Appl. Phys. Lett. 53(21) Nov. 1988 pp. 2096-2098.
Moreland et al, "Break-junction tunneling measurements of the high-Tc superconductor YiBa$_2$Cu$_3$O$_{9-\delta}$", Phys. Rev. B 35(16) Jun. 1987 pp. 8856-8857.
Mizuno et al, "Fabrication of thin-film-type Josephson junctions using a Bi—Sr—Ca—Cu—O/Bi—Sr—Cu—O/Bi—Sr—Ca—Cu—O structure" Appl. Phys. Lett. 56(15) Apr. 1990, pp. 1469-1471.
Tsuge, Hisanao, et al., "Superconducting Lines Fabricated From Epitaxial Y-Ba-Cu-O Films", Jap. Journal of Applied Physics. vol. 27 No. 11, Nov. 1988, pp. L2237-L2239.
B. W. Hussey, et al., "Laser-assisted etching of YBa$_2$Cu$_3$O$_{7-\delta}$" IBM Thomas J. Watson Research Center, Appl. Phys. Lett. 54(13), Mar. 27, 1989, pp. 1272-1274.
Komuro, Masanori, et al., "Maskless etching of a nanometer structure by focused ion beams", J. Vac. Scl, Technol. B1(4), Oct.-Dec. 1983, pp. 985-989.

Primary Examiner—Shrive Beck
Assistant Examiner—Roy V. King
Attorney, Agent, or Firm—Spensley Horn Jubas & Lubitz

[57] ABSTRACT

A method of forming a fine groove on a superconducting thin film. A superconducting oxide thin film is formed on a MgO substrate, and a damaged layer is formed thereon by irradiating the superconducting thin film with focused ion beams to such a degree that not sputter is generated and the crystalline structure of the superconducting thin film is disturbed. The damaged layer is then removed by treatment with a strong alkali such as KOH. Thus, a fine groove is effectively formed. By inserting an oxide layer between the substrate and the superconducting thin film, a Josephson junction device suitable for superconducting transistors is produced.

11 Claims, 15 Drawing Sheets

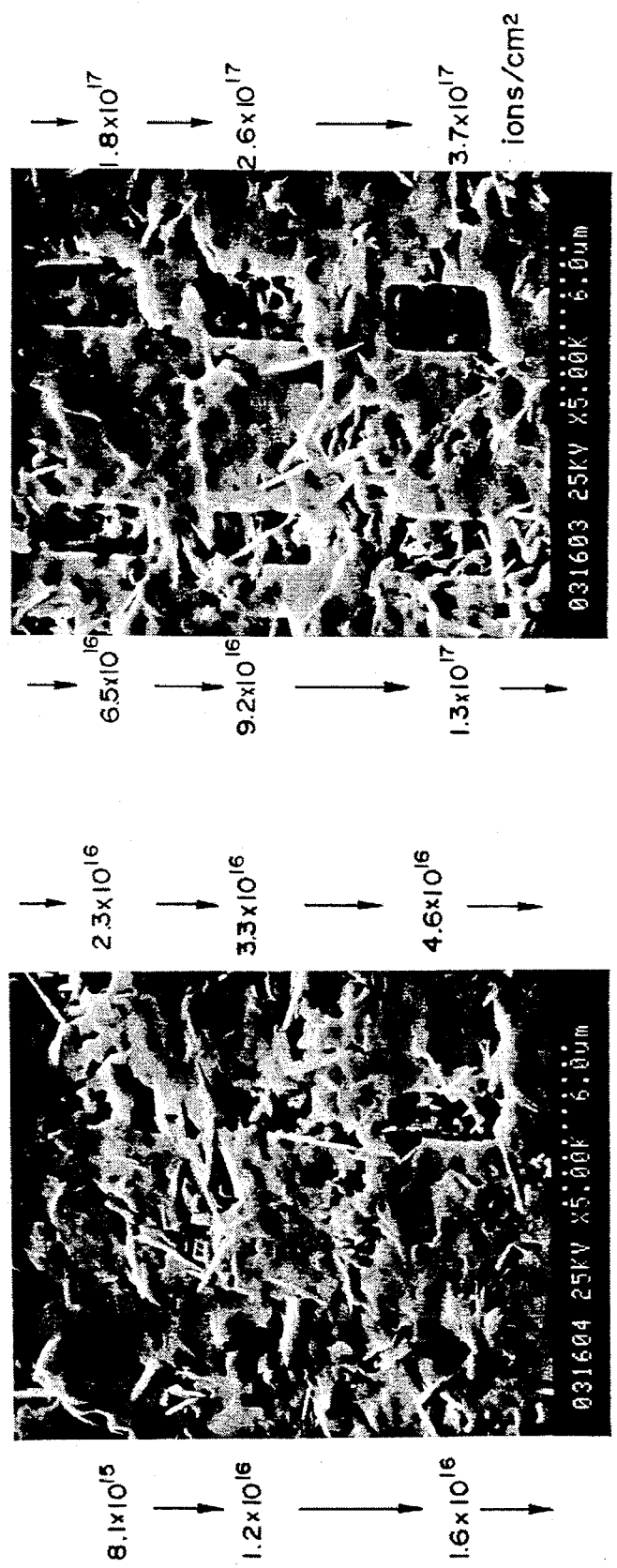

METHOD OF FORMING PATTERNED OXIDE SUPERCONDUCTING FILMS AND JOSEPHSON JUNCTION DEVICES BY USING AN AQUEOUS ALKALINE SOLUTION

BACKGROUND OF THE INVENTION

1. Field of the Invention

The present invention relates to a method of processing a superconducting thin film such as forming a fine groove on a superconducting thin film, and a method of producing a Josephson junction device by utilizing such a processing method.

2. Description of the Related Art

In a superconductive device such as a superconducting transistor and a superconducting quantum interference device, a Josephson junction such as SNS (superconductor.normal conductor.superconductor) junction and SIS (superconductor.insulator.superconductor) junction is adopted. A Josephson junction is easily effected by deposited SNS layers in series. However, when thin films are deposited in this way, it is difficult to attach electrodes to each thin film. As a countermeasure, each thin film is separated into a plurality of parts by forming a minute groove of the like on the thin film, and an electrode is attached to each part. Since this is a planar structure in which two superconducting thin films are arranged in parallel in the same plane, attachment of electrodes or the like is greatly facilitated.

As a method of forming a fine groove or the like on a thin film of an oxide super conductor such as Bi-Ca-Sr-Cu-O, an etching method such as ion beam sputter etching and laser assisted etching are known. As an example of ion beam sputter etching, a method of processing a thin film by focused ion beams (FIB) is shown in FIG. 13. This is a method of irradiating a superconducting film 12 on a MgO substrate 11 with ion beams 13 at an accelerating energy of several ten to several hundred KeV and focussed into about 1 to 0.1 $\mu$m so as to form a groove 15 by sputtering.

Another example of ion beam sputter etching is shown in FIG. 14(a). This is a method of forming a desired pattern on the superconducting thin film 12 with a resist 16 which is deposited thereon, irradiating the entire part of the thin film 12 with ion beams 13 of Ar or the like so as to form the grooves 15 by sputtering the parts which are not covered with the resist 16, as shown in FIG. 14(b), and thereafter removing the resist 16, as shown in FIG. 14(c). (H. Tsuge et al., Jpn. J. Appl. Phys. Vol. 27, No. 11, November, 1988, pp. L2237 to L2239).

Laser assisted etching is a method of immersing a superconductor (or superconducting thin film) 6 in an aqueous solution 7 of KOH, and irradiating the superconductor 6 with laser beams 8 so as to rise the temperature of the irradiated part and dissolve the irradiated part of the superconductor 6 in the aqueous solution 7, as shown in FIG. 15. (B. W. Hussey and A. Gupta, Appl. Phys. Lett. 54 (13), 27 March 1989, pp. 1272 to 1274).

The above-described conventional methods, however, have the following problems.

Firstly, in ion beam sputter etching, since the constitutional substances of the superconducting thin film are sputtered out, a damaged layer is formed on the side surface of the groove obtained by sputtering. Due to the existence of the damaged layer, the effective width of the gap in the superconducting thin film is made larger than the width of the groove. Although the crystallinity of the damaged layer is recovered to a certain extent by appropriate annealing, since the shape of the groove changes, particularly fine grooves may inconveniently be brought into contact with each other.

Secondly, when a particularly narrow groove is formed, the elements of the superconducting thin film which are to be etched are difficult to remove and adhere again to the side surface of the processed groove. Therefore, the width of the processable groove is limited, and since the layer of adhered elements is not a superconductive layer, the effective gap is made larger than the apparent width of the groove.

Thirdly, in ion beam sputter etching, control of the dosage for the purpose of controlling the etching depth is very delicate and difficult. That is, if the dosage is too large, the substrate is also etched, while too small a dosage leads to the existence of a residual superconducting thin film.

On the other hand, in laser assisted etching, since the spot diameter of the laser beam with which the superconductor is irradiated is limited by diffraction, and the effect of local rise of the temperature is utilized, it is very difficult to form a very fine groove such as a groove of about 0.1 $\mu$m wide.

SUMMARY OF THE INVENTION

Accordingly, it is an object of the present invention to solve the above-described problems in the related art and to provide a method of processing a superconducting thin film which enables the effective separation of a superconducting thin film and a method of producing a Josephson junction device by utilizing such a processing method.

To achieve this end, a method of processing a superconducting thin film according to the present invention comprises the steps of forming a damaged layer by irradiating the superconducting thin film with ion beams, and removing the damaged layer by treatment with an aqueous alkaline solution. A method of producing a Josephson junction device according to the present invention comprises the step of forming a groove by the above-described processing method on a superconductive film formed on a substrate through an oxide thin film, thereby producing a planar Josephson junction device.

A superconducting thin film is irradiated with ion beams at a desired position, and ions are implanted at that part. The ion implantation disturbs the crystalline structure of the part, thereby forming a damaged layer. The crystalline structure of the damage layer is different from that of the other part which is not irradiated with the ion beams (hereinunder referred to as "non-irradiated part"). The solubility of the damaged layer to an appropriate etchant is therefore different from the solubility of the non-irradiated part.

In the present invention, by immersing the superconducting thin film which has been irradiated with the ion beams in an aqueous alkaline solution (etchant), the damaged layer is dissolved and removed, thereby obtaining a desired groove pattern. This is based on the finding that the dissolving speed of the damaged layer to an alkaline aqueous solution is higher than the dissolving speed of the non-irradiated part.

Since the damaged layer is removed by the alkaline aqueous solution, the width of the groove is equal to the effective width of the gap. The first problem in ion beam sputter etching, namely, the problem that the effective width of the gap is made larger than the width of the groove due to the existence of the damaged layer is solved in this way.

Since the superconductive film is not processed by sputter etching in the present invention, the second problem in ion beam sputter etching, namely, the problem that the width of the groove is limited due to the existence of the layer of adhered elements is not produced. In addition, in the present invention, ions are implanted in the superconducting thin film by irradiation by ion beams. It is possible to control the depth to which ions enter by controlling the accelerating energy of ions, which is comparatively easy if the above-described dosage is controlled. In this way, it is possible to exactly control the depth of the groove.

Since the effect of local rise of temperature by laser beams is not utilized in the present invention, the method of the present invention is free from the problem in laser assisted etching that it is very difficult to form a very fine groove.

In addition, according to the present invention, after an oxide thin film is formed on the substrate, a superconducting thin film is formed on the oxide thin film, and a groove is formed by the above-described processing method. It is therefore possible to produce an accurate groove and to produce a Josephson junction from a pair of superconducting thin films which are separated from each other by the groove and the oxide thin film. Thus, it is possible to produce a planar Josephson junction device which is suitable for superconducting transistors, etc.

The above and other objects, features and advantages of the present invention will become clear from the following description of the preferred embodiments thereof, taken in conjunction with the accompanying drawings.

BRIEF DESCRIPTION OF THE DRAWINGS

FIGS. 1(a) and 1(b) show an embodiment of a method of processing a superconducting thin film according to the present invention, wherein FIG. 1(a) is a schematic sectional view of the superconducting thin film in the state of forming a damaged layer by irradiation by FIB's; and FIG. 1(b) is a schematic sectional view of the superconducting thin film with the damaged layer removed therefrom;

FIGS. 3(a) and 3(b) are scanning electron micrographs of the crystalline structures of the vicinity of a groove in the superconducting thin film in the embodiment shown in FIG. 1, wherein FIG. 3(a) shows the state before alkali treatment; and
FIG. 3(b) shows the state after alkali treatment;

FIGS. 4(a) and 4(b) are scanning electron micrographs of the crystalline structures of the vicinity of a groove in the superconducting thin film in the embodiment shown in FIG. 1, wherein FIG. 4(a) shows the superconducting thin film irradiated with ion beams at a dosage of $8.1 \times 10^{15}$ to $4.6 \times 10^{16}$ ions/cm$^2$; and FIG. 4(b) shows the superconducting thin film irradiated with ion beams at a dosage of $6.5 \times 10^{16}$ to $3.7 \times 10^{17}$ ions/cm$^2$;

FIG. 5(a) to 5(d) show the state of a groove in FIG. 4 when the thin film is irradiated at too large a dosage and the ion implanting characteristics, wherein FIG. 5(a) is a plan view of the state of the groove;
FIG. 5(b) is an elevational sectional view thereof;
FIG. 5(c) shows ion beam irradiation characteristic; and
FIG. 5(d) shows the ideal ion beam irradiation characteristic;

FIGS. 8(a) to 8(d) show a second embodiment of a method of processing a superconducting thin film according to the present invention, wherein FIG. 8(a) is a schematic sectional view of the superconducting thin film with a resist pattern formed thereon;

FIG. 8(b) is a schematic sectional view of the superconducting thin film in the state of forming a damaged layer by irradiation by ion beams;

FIG. 8(c) is a schematic sectional view of the superconducting thin film with the damaged layer removed therefrom; and FIG. 8(d) is a schematic sectional view of the superconducting thin film with the resist pattern removed therefrom;

FIGS. 14(a) to 14(c) show another example of conventional ion beam sputter etching, wherein FIG. 14(a) is a schematic sectional view of the superconducting thin film with a resist pattern formed thereon;

FIG. 14(b) is a schematic sectional view of the superconducting thin film in the state of forming a damaged layer by irradiation by ion beams; and FIG. 14(c) is a schematic sectional view of the superconducting thin film with the resist pattern removed therefrom.

DESCRIPTION OF THE PREFERRED EMBODIMENTS

FIRST EMBODIMENT

Figure 1A:
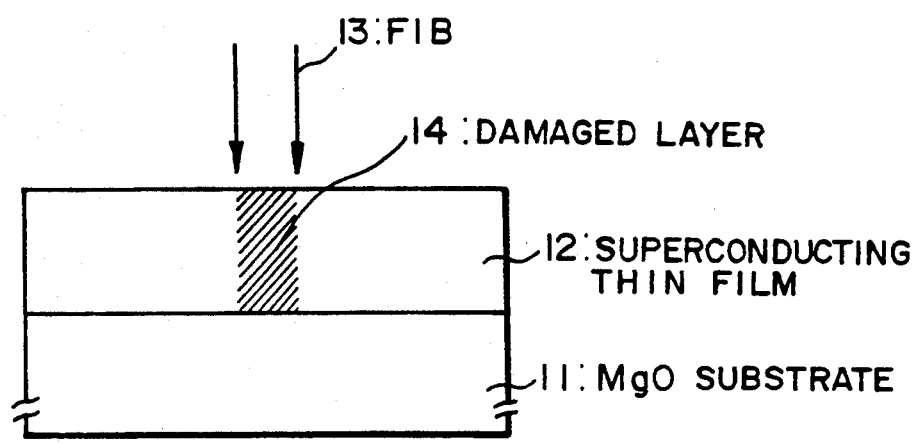
Figure 1B:
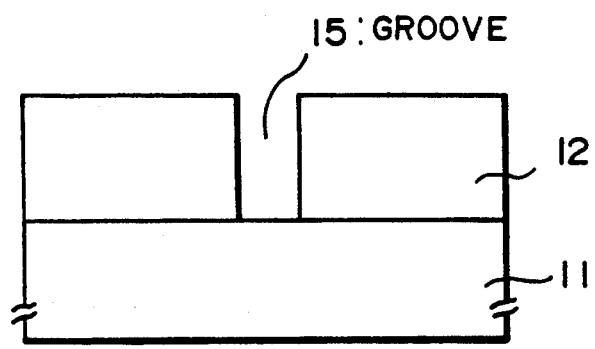

FIGS. 1(a) and 1(b) show an embodiment of a method of processing a superconducting thin film according to the present invention, wherein FIG. 1(a) is a schematic sectional view of the superconducting thin film in the state of forming a damaged layer by irradiation by FIB's; and FIG. 1(b) is a schematic sectional view of the superconducting thin film with the damaged layer removed therefrom. Although a superconducting thin film actually has a thickness of about 1/1000 of the thickness of a substrate 11, a superconducting thin film 12 is enlarged in FIGS. 1(a) and 1(b) by using different scales for the superconducting thin film 12 and the substrate 11 so as to facilitate the understanding.

MgO, $SrTiO_3$, YSZ (zirconia stabilized by yttria), $Al_2O_3$, $LaAlO_3$, etc. are usable for the insulating substrate 11. In this embodiment, a (100) MgO substrate is used.

The superconducting thin film 12 of a BiCaSrCu oxide is formed on the surface of the substrate 11 by depositing the atoms ejected from a sintered target on the substrate 11 by Rf magnetron sputtering.

The sintered target is formed by the solid phase reaction of high-purity reagents, as will be described in the following.

Four different high-purity reagents ($Bi_2O_3$ having a purity of 99.999%, $SrCO_3$ having a purity of 99.99%, $CaCO_3$ having a purity of 99.99% and CuO having a purity of 99.99%) are added to an organic solvent such as ethanol and methanol, and stirred with a stirrer. After evaporating the organic solvent, the remnant is ground up into a powder in a mortar. The powder is calcined at 875° C. for 1 hour in an electric oven, and the calcined powder is press molded in a molding press under a pressure of 760 kgf/cm² into the form of a pellet. The pellet is sintered at 880° C. for 1 hour in air to obtain a sintered target. In this way, a sintered target of $Bi_2Ca_1Sr_2Cu_2O_x$ 10 cm in diameter and 0.5 cm in thickness is obtained.

By using the sintered target, the superconducting thin film 12 of a BiCaSrCu oxide is formed on the substrate 11 by an Rf magnetron sputtering apparatus.

Figure 2:
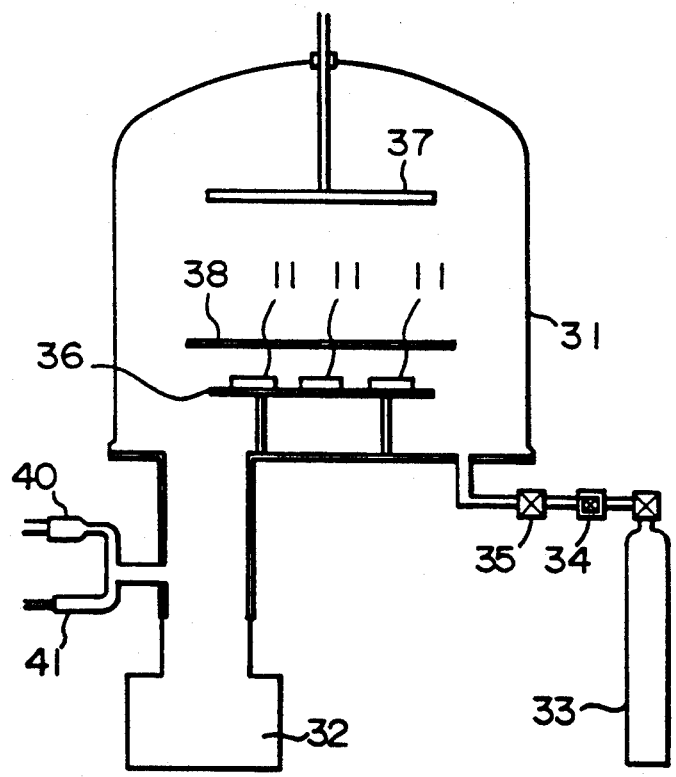
FIG. 2 schematically shows the structure of a sputtering apparatus.

The sputtering apparatus has the structure shown in FIG. 2. An evacuation system 32 and an argon gas bomb 33 and an oxygen bomb (not shown) are connected to a bell jar 31. The argon gas bomb 33 and the oxygen bomb (not shown) are connected to the bell jar 31 through variable leak valves 34 and stop valves 35. An anode 36 and a cathode 37 are opposed to each other through a shutter 38 in the bell jar 31.

The substrate 11 on the surface of which the superconducting thin film 12 is to be formed is placed on the surface of the anode 36 at a position 45 mm distant from the cathode 37.

In this embodiment, MgO is used for the substrate 11. The cathode 37 is composed of the sintered target in this embodiment. A high vacuum gauge 40 and a low vacuum gauge 41 are provided so as to measure the pressure in the bell jar 31.

The superconducting thin film 12 was formed under the following conditions. A negative voltage as high as 2.6 kV was applied to the sintered target.

Argon gas having a purity of 99.9995% and oxygen gas having a purity of 99.999% were introduced into the bell jar 31 at a ratio of 1:1 under a pressure of 4 m Torr. By sputtering at an output of 150 W, the thin film 12 having the same composition as the target was formed on the substrate 11 to a thickness of 0.1 to 5 μm at a growth rate of 270 A/min. The temperature of the substrate 11 may be 200° to 600° C. In this embodiment, the temperature was set at 280° C.

The thus-formed thin film was insulating as a whole, it was amorphous according to the X-ray diffraction pattern, and the surface thereof was a mirror surface. The substrate 11 on the thin film 12 formed thereon was then taken out of the sputtering apparatus and charged into an electric oven. The temperature of the oven was raised from room temperature to 800° C. at a rate of 1° C./sec in an oxygen stream which was flowing at a rate of 2 l/min, and the substrate 11 was subjected to annealing at 800° C. for 1 hour. The temperature of the oven was then cooled to room temperature at a rate of −20° C./sec. By this treatment, the thin film 12 assumed a predetermined crystalline state, namely, becoming the superconducting thin film 12. In this way, the superconducting thin film 12 was formed on the substrate 11.

As shown in FIG. 1(a), a damaged layer 14 is formed on the superconducting thin film 12 obtained in the above described way by irradiation by ion beams. In this embodiment, the superconducting thin film 12 was irradiated at an accelerating energy of 200 keV with focused ion beams (FIB) 13 having $Si^{++}$ as an ion source to form the damaged layer 14. It was clear from various experiments that the preferred dosage is about $1 \times 10^{17}$ ions/cm². In this embodiment, the dosage was set at about $7 \times 10^{16}$ ions/cm². After the damaged layer 14 was formed in this way, the superconducting thin film 12 was immersed for etching in an etchant of an aqueous solution of a 1N KOH at 25° C. for 5 minutes and then washed with pure water. In this way, a groove 15 was formed, as shown in FIG. 1(b).

Figure 3A:
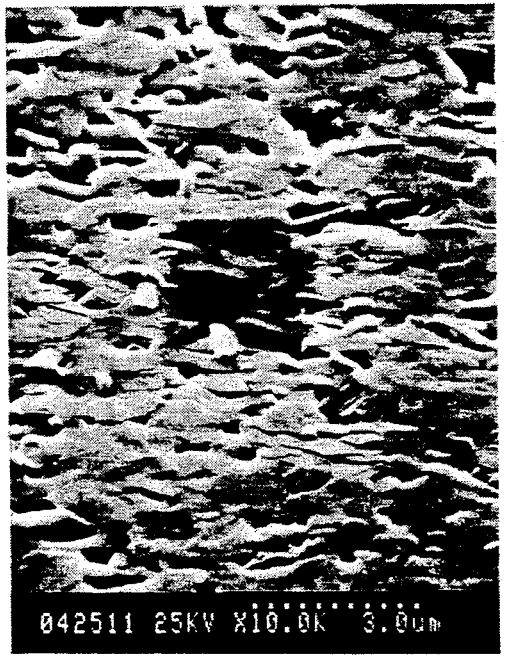
Figure 3B:
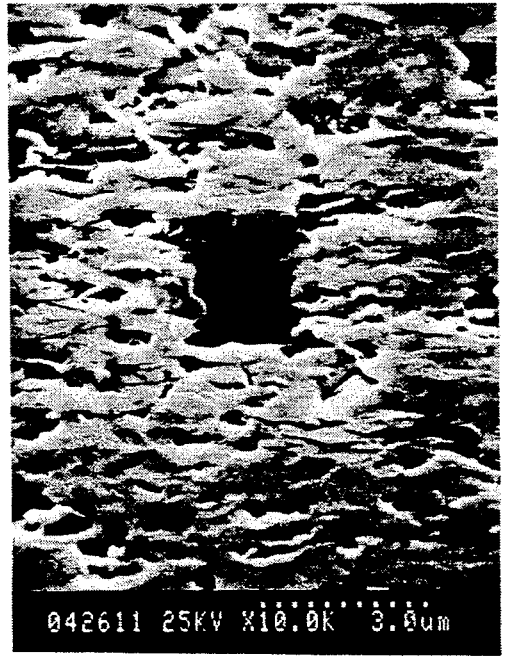

FIGS. 3(a) and 3(b) show the state of the damaged layer formed by irradiation by ion beams at a dosage of $6.5 \times 10^{16}$ ions/cm². FIG. 3(a) shows the state before alkali treatment; and FIG. 3(b) shows the state after alkali treatment. From these drawings, it is clear that the structure of the part of the superconducting thin film 12 which was irradiated with ion beams was changed and formed the damaged layer 14, and that the damaged layer 14 was accurately removed by alkali treatment.

In this embodiment, the superconducting thin film 12 was irradiated with $Si^{++}$ ions at an accelerating energy of 200 keV, but when the present inventor irradiated the superconducting thin film with $Au^+$ ions at an accelerating energy of 100 keV or $Au^{++}$ ions at an accelerating energy of 200 keV at a dosage Dc of $5 \times 10^{15}$ ions/cm² and treated with an aqueous solution of a 1-N KOH at 25° C. for 5 minutes, approximately the same result as in the first embodiment was obtained in both cases. Other ions may be used in a similar way.

FIGS. 4(a) and 4(b) are scanning electron micrographs (SEM) of the embodiment. A Bi-based superconducting thin film was irradiated with the focused ion beams of $Si^{++}$ at an accelerating energy of 200 keV so as to form the damaged layer 14 thereon and it was thereafter treated with an aqueous solution of a 5-N NaOH at 25° C. for 5 minutes. The dosage of ion beams was varied from $8.1 \times 10^{15}$ to $3.7 \times 10^{17}$ ions/cm². When the dosage was in the range of $8.1 \times 10^{15}$ to $3.3 \times 10^{16}$ ions/cm², although a part of the thin film 12 was etched, whether or not the superconducting thin film was etched is not very clear. When the dosage was in the range of $4.6 \times 10^{16}$ to $2.6 \times 10^{17}$ ions/cm², a rectangular recessed portion was clearly formed. It is therefore observed that etching is carried out by irradiation by ion beams at a dosage of not less than $4.6 \times 10^{16}$ ions/cm².

On the other hand, when the dosage was further increased to $3.7 \times 10^{17}$ ions/cm², only the outline of a rectangular pattern was etched and the central portion thereof was remained un-etched. It is therefore observed that the dosage of ions is preferably not more than $2.6 \times 10^{17}$ ions/cm$^2$. In other words, the preferred dosage is in the range of $4.6 \times 10^{16}$ to $2.6 \times 10^{17}$ ions/cm$^2$.

Figure 5A:
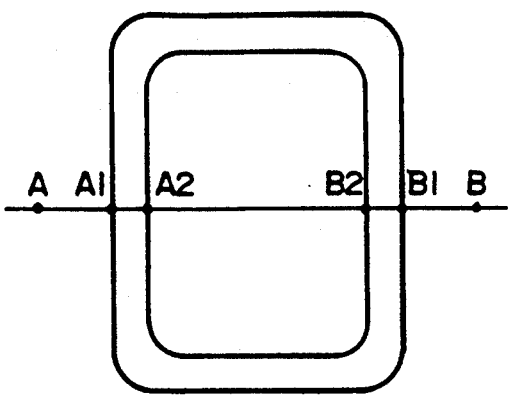
Figure 5B:
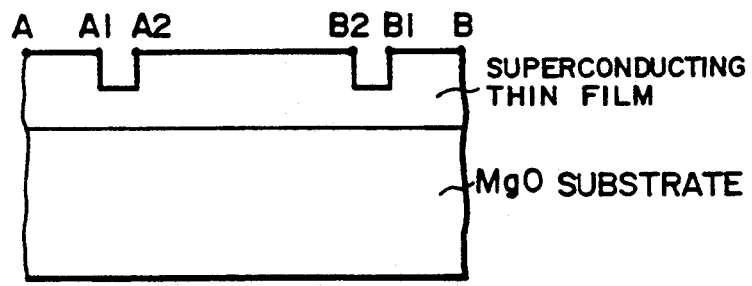
Figure 5C:
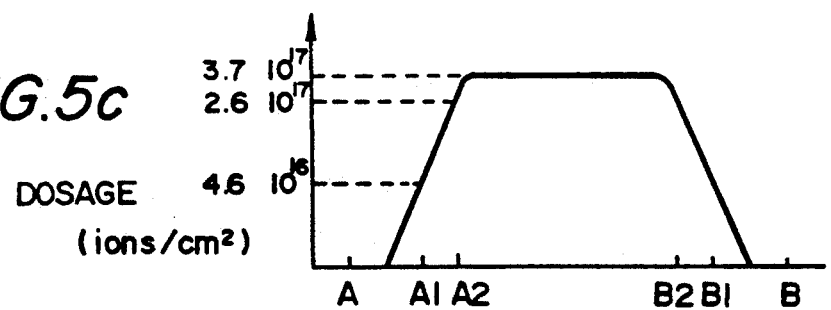
Figure 5D:
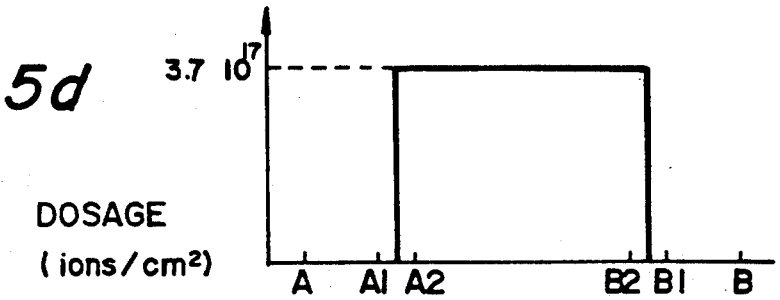

The reason why only the outline is etched when ions are implanted at too large a dosage is considered to be as follows. In the ideal ion implantation, ions are preferably implanted at the same dosage in the region which is to be irradiated with ion beams, as shown in FIG. 5(d). However, the diameter of an FIB is not 0 but about 0.5 to 1.0 μm. The actual distribution of ion dosage is therefore as shown in FIG. 5(c), and a phenomenon which is called gradation is produced on the outline portion, that is, the dosage at the outline portion gradually changes. As a result, the dosage at the outline portion reaches the range which allows etching, so that only the outline portion is etched.

Too much a dosage of ion implantation obstructs etching. This is considered to be because when ions are implanted to excess, the composition of the damaged layer changes so that the damaged layer is not dissolved in an aqueous alkaline solution.

A similar phenomenon is also seen in the implantation of Au$^+$ ions at an accelerating energy of 100 keV and Au$^{++}$ ions at an accelerating energy of 200 keV. From these experiments, the ion dosages which allow etching are collectively shown in the following.

200 keV Si$^{++}$ about $4.6 \times 10^{16}$ to about $2.6 \times 10^{17}$ ions/cm$^2$ 100 keV Au$^+$ about $4 \times 10^{15}$ to about $2 \times 10^{16}$ ions/cm$^2$ 200 keV Au$^{++}$ about $4 \times 10^{15}$ to about $2 \times 10^{16}$ ions/cm$^2$ 200 keV Be$^+$ about $8 \times 10^{17}$ to (unconfirmed) ions/cm$^2$ Nuclear collision energy of each ion at the critical dosage which allows etching is shown in Table 1.

TABLE 1

|  | Ion dosage ions/cm$^2$ | Nuclear collision energy eV · nm$^{-1}$ · ion | Nuclear collision energy eV · nm · −3 |
|---|---|---|---|
| 200 keV Au$^{++}$ | $4 \times 10^{15}$ | 2110 | $8.9 \times 10^4$ |
| 200 keV Si$^{++}$ | $4 \times 10^{16}$ | 150 | $6.0 \times 10^4$ |
| 200 keV Be$^{++}$ | $8 \times 10^{17}$ | 8.35 | $6.7 \times 10^4$ |

From Table 1, is observed that the damage layer which allows etching is obtained at approximately the same nuclear collision energy. That is, there is no restriction to the kind of ions which are implanted in order to form a damaged layer so long as the nuclear collision energy takes a similar value to those in Table 1. The nuclear collision energy was calculated by the known simulation called Monte Carlo simulation.

Figure 6:
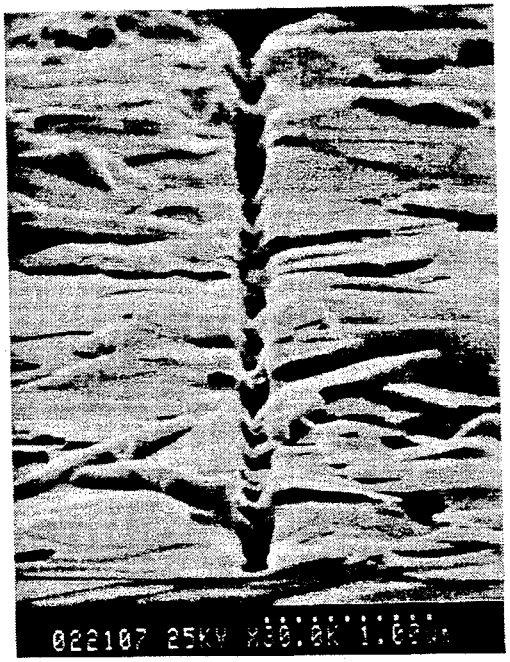
FIG. 6 is a scanning electron micrograph of the crystalline structure of the vicinity of a shallow groove in the superconducting thin film in the embodiment.

FIG. 6 is a scanning electron micrograph of the crystalline structure of the vicinity of a shallow groove in a superconducting thin film. The shallow groove was formed by implanting ions in accordance with the first embodiment while making the thickness of the layer in which ions are implanted smaller than the thickness of the superconducting thin film. From this photograph, it is observed that the width of the groove vertically formed at the central portion is 0.15 μm. This is a photograph taken at an electron accelerating voltage of 25 KV by 30,000 magnifications. The length between both end portions of the 11 points at the lower portion of the photograph is 1.00 μm.

Since the thickness of the layer in which ions are implanted when the accelerating energy of ion beams is 200 keV is 0.2 to 0.3 μm, if the thickness of the superconducting thin film is made smaller than the thickness of this layer, it is possible to completely remove the superconducting thin film at the portion in which ions are implanted. In this way, the thickness of the superconducting thin film may be set at the thickness which allows ion implantation. It is also possible to increase the thickness of the layer in which ions are implanted by using lighter ions or increasing the accelerating energy, thereby completely removing the superconducting thin film at the portion in which ions are implanted.

In this embodiment, ions are implanted by FIB's. A method of etching by FIB sputtering is conventionally known. For example, a method of etching a superconducting thin film by FIB sputtering using Au+ at an accelerating energy of 80 keV is described in "5-th International Workshop on Future Electron Devices", Jun. 2 to 4, 1988, Miyagi Zao, pp. 245 to 249. However, the dosage in this case is $1 \times 10^{17}$ to $10^{18}$ ions/cm$^2$, which is about $10^2$ larger than the dosage in this embodiment. It will thus be understood that the conventional sputter etching is quite different from the formation of a damaged layer by ion implantation in the present invention. It is clear from FIG. 3(a) that sputtering is not caused in this embodiment.

Experiments were then made by varying the concentration and the temperature of an aqueous solution of KOH as an etchant and the treating time. The results are shown in Table 2. Each superconducting thin film was washed with pure water after being treated with the aqueous solution of KOH.

TABLE 2

| Sample No. | Concentration (N) | Temperature (°C.) | Treating time (min) | Dosage (Dc) (ions/cm$^2$) | Dc portion* | Other portion** |
|---|---|---|---|---|---|---|
| 1 | 0.1 | 25 | 5 | — | No change | No change |
| 2 | 1 | 20 | 2 | about $9 \times 10^{16}$ | Insufficiently removed | No change |
| 3 | 1 | 25 | 5 | about $7 \times 10^{16}$ | Removed | No change |
| 4 | 1 | 25 | 20 | about $7 \times 10^{16}$ | Removed | No change |
| 5 | 1 | 60 | 5 | about $5 \times 10^{16}$ | Removed | No change |
| 6 | 1 | 60 | 30 | about $5 \times 10^{16}$ | Removed | Foreign substance*** |
| 7 | 1 | 90 | 1 | about $5 \times 10^{16}$ | Removed | Foreign substance |
| 8 | 1 | 90 | 5 | about $5 \times 10^{16}$ | Removed | Foreign substance |
| 9 | 5 | 25 | 5 | about $3 \times 10^{16}$ | Removed | No change |
| 10 | 5 | 25 | 5 | about | Removed | Foreign |

TABLE 2-continued

| Sample No. | Concentration (N) | Temperature (°C.) | Treating time (min) | Dosage (Dc) (ions/cm²) | Dc portion* | Other portion** |
|---|---|---|---|---|---|---|
| 11 | 10 | 25 | 5 | about 3 × 10¹⁶ | Removed | substance No change |
| 12 | 10 | 25 | 20 | about 3 × 10¹⁶ | Removed | Foreign substance |

*Dc portion: the portion in which ions were implanted at a dosage of not less than Dc, i.e., the damaged layer 14
**Other portion: the portion in which ions were implanted at a dosage of less than Dc
***Foreign substance: irremovable substance adhered to the surface of the other portion when it was washed with pure water or alcohol In Table 2, it is desirable that the column of "Dc portion" is filled with "Removed" and the column of "Other portion" is filled with "No change". Samples Nos. 3, 4, 5, 9 and 11 are desirable in these respects. In samples Nos. 5, 9 and 11, the critical temperature at which the resistance of the portion without implantation of ions becomes zero was slightly lowered. Therefore, the conditions for Samples Nos. 3 and 4 are best.

An aqueous solution of NaOH was used in place of an aqueous solution of KOH while varying the concentration and the temperature thereof and the treating time. The results are shown in Table 3.

TABLE 3

| Sample No. | Concentration (N) | Temperature (°C.) | Treating time (min) | Dosage (Dc) (ions/cm²) | Dc portion* | Other portion** |
|---|---|---|---|---|---|---|
| 13 | 1 | 25 | 5 | about 7 × 10¹⁶ | Removed | No change |
| 14 | 1 | 60 | 5 | about 5 × 10¹⁶ | Removed | No change |
| 15 | 1 | 60 | 20 | about 5 × 10¹⁶ | Removed | Foreign substance |
| 16 | 5 | 25 | 5 | about 3 × 10¹⁶ | Removed | No change |
| 17 | 5 | 25 | 20 | about 3 × 10¹⁶ | Removed | Foreign substance |

In Table 3, Samples Nos. 13, 14 and 16 are desirable, but in samples Nos. 14 and 16, the critical temperature at which the resistance of the portion without implantation of ions becomes zero was slightly lowered. Therefore, the conditions for Sample No. 13 are best. It is clear that an aqueous solution of NaOH has approximately the same effect as an aqueous solution of KOH.

When the same experiments were carried out by using a saturated aqueous solution of Ba(OH)₂ (about 0.5 N) which exhibits similar alkalinity to those of an aqueous solution of KOH and an aqueous solution of NaOH, the same results of Samples Nos. 3 and 4 in Table 1 were obtained under the treating conditions that the temperature of the aqueous solution was 25° C. and the treating time was 5 to 20 minutes. It is therefore clear that an aqueous solution of Ba(OH)₂ has approximately the same effect as an aqueous solution of KOH. Aqueous solutions of a strong alkali such as LiOH, RbOH, CsOH and Sr(OH)₂ also produces approximately the same effect.

Experiments were next carried out by using a saturated aqueous solution of Ca(OH)₂ (about 0.02 N), which has a slightly weak degree of alkalinity. Under the treating conditions that the temperature of the aqueous solution was 25° C. and the treating time was 5 to 20 minutes, the removal of the damaged layer was insufficient as in Sample No. 2 in Table 2. It is therefore obvious that sufficient etching is impossible when the degree of alkalinity is weak. Similarly, it is considered that Mg(OH)₂, Be(OH)₂ and hydroxides of transition metals cannot produce a sufficient effect because the solubility to water is small and the degree of alkalinity of an aqueous solution thereof is weak.

Figure 7:
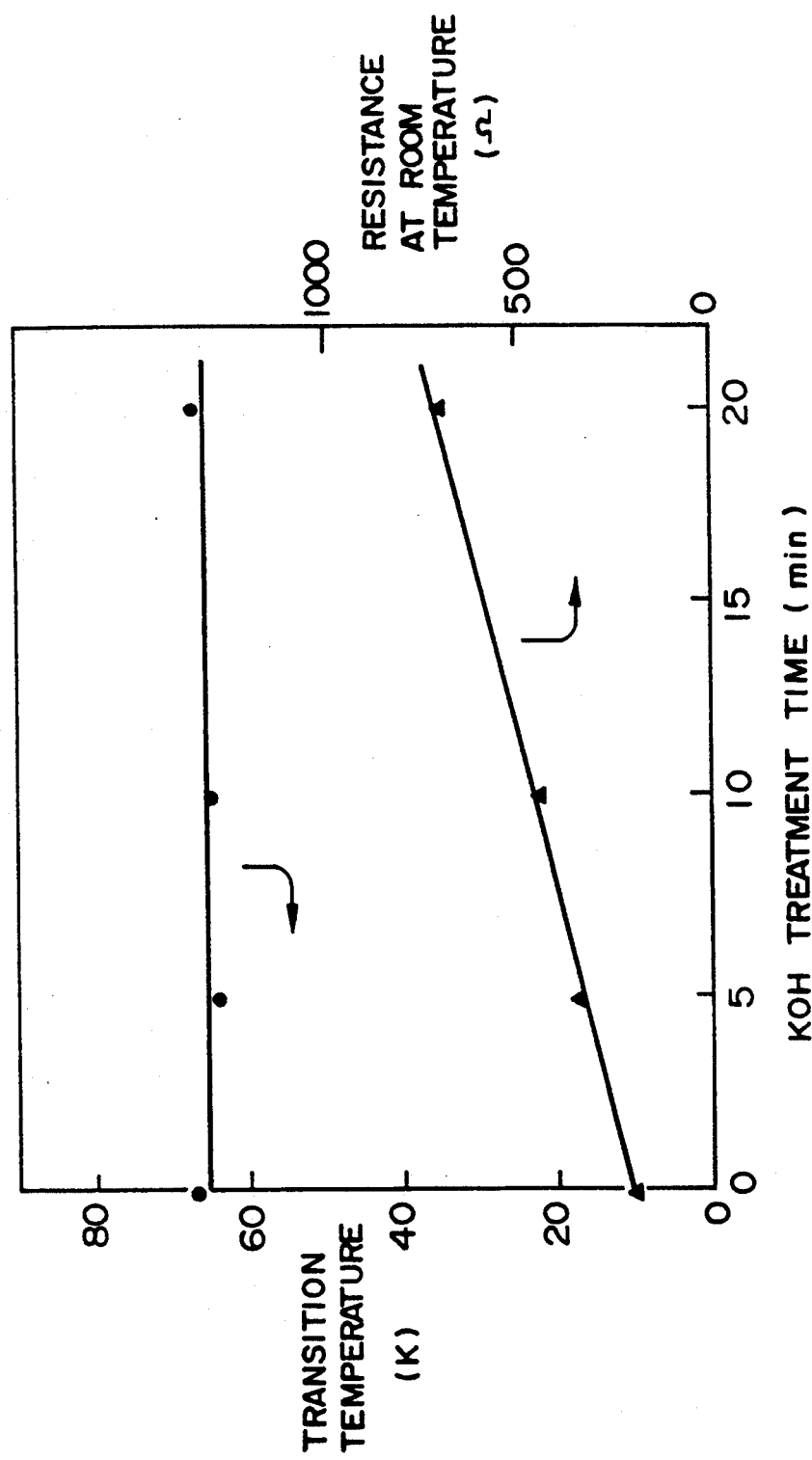
FIG. 7 shows the characteristics of the effect of alkali treatment on the superconducting thin film in the embodiment.

FIG. 7 shows the relationship between the alkali treating time by KOH and the property of a superconducting thin film. As is clear from FIG. 7, even if the alkali treating time is prolonged, there is no change in the temperature at which the thin film assumes a superconductive state (transition temperature). On the other hand, when the alkali treating time is prolonged, the electric resistance at normal temperature is gradually increased. It is therefore considered that alkali treatment exerts slight influence on the superconducting thin film so that the alkali treating time as short as possible is desirable.

SECOND EMBODIMENT

Figure 8A:
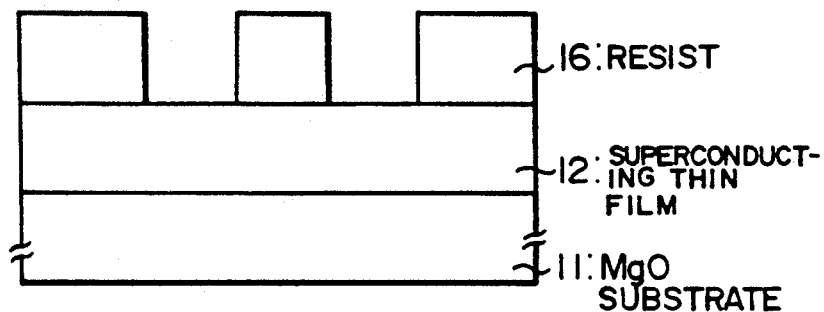
Figure 8B:
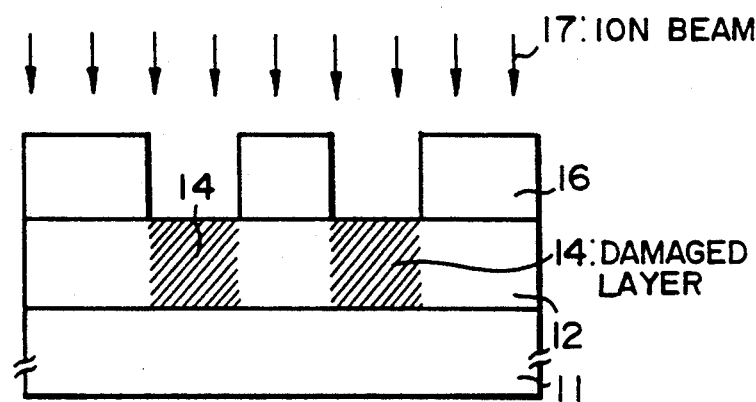
Figure 8C:
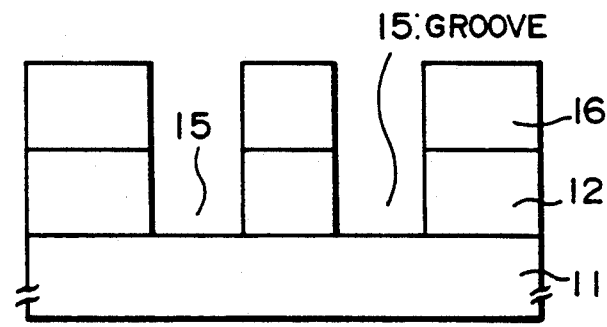
Figure 8D:
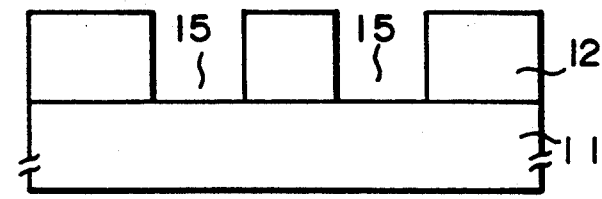

FIGS. 8(a) to 8(d) show a second embodiment of a method of processing a superconducting thin film according to the present invention, wherein FIG. 8(a) is a schematic sectional view of the superconducting thin film with a resist pattern formed thereon;

FIG. 8(b) is a schematic sectional view of the superconducting thin film in the state of forming a damaged layer by irradiation by ion beams;

FIG. 8(c) is a schematic sectional view of the superconducting thin film with the damaged layer removed therefrom; and FIG. 8(d) is a schematic sectional view of the superconducting thin film with the resist pattern removed therefrom.

The insulating substrate 11 and the superconducting thin film 12 are the same as those in the first embodiment, and a resist pattern 16 is formed on the superconducting thin film 12. Ion beams 17 of Ar, Ne, Si++ or the like are projected from above the resist pattern 16 to the entire surface of the superconducting thin film 12 so as to form the damaged layer 14, as shown in FIG. 8(b). In this embodiment, the ion beams 17 of Si++ or the like were used at an accelerating energy of 200 keV.

The superconducting thin film 12 with the damaged layer 14 formed thereon was immersed in an etchant to form the grooves 15, as shown in FIG. 8(c), and the resist pattern 16 was then removed to produce the superconducting thin film 12 having the grooves 15, as shown in FIG. 8(d). The etching conditions in this embodiment were the same as those in the first embodiment.

In this way, it is possible to separate the superconducting thin film by effectively forming the grooves in the second embodiment as in the first embodiment.

In these embodiments, all samples of a superconducting thin film were obtained by depositing the superconducting thin film on the insulating substrate by an Rf magnetron sputtering apparatus and subjecting the superconducting thin film to annealing, but a similar effect was obtained from the samples which were not subjected to annealing. In this case, by annealing the thin film after a desired pattern is formed thereon, the superconducting thin film having the desired pattern is obtained.

Although a BiCaSrCuO thin film was used in these embodiments, the present invention is also applicable to a YBaCuO thin film and a TlBaCaCuO thin film. In these cases, it is desirable that the aqueous alkali solution treating time is as short as possible because Ba is weak to water.

It is possible to produce a superconducting device by forming a good SNS (superconductor. normal conductor. superconductor) Josephson junction by burying, for example, a normal conductor in the groove obtained in this embodiment.

JOSEPHSON JUNCTION DEVICE

Figure 9:
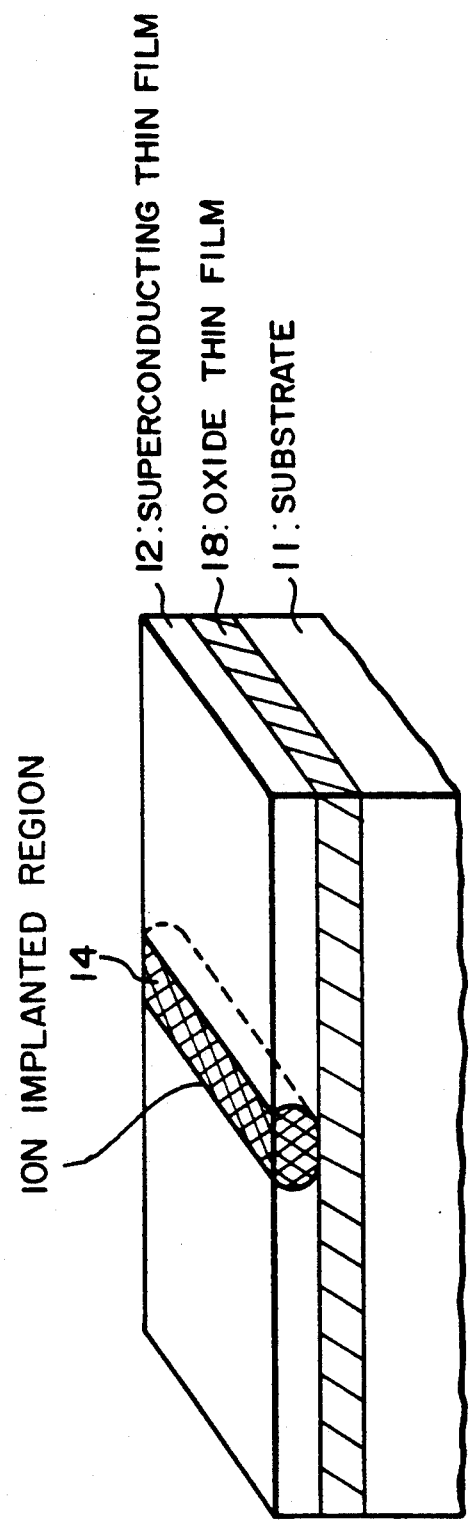
FIG. 9 is an external perspective view of the structure of an embodiment of a Josephson junction device according to the present invention.

A method of producing a planar Josephson junction device is shown in the following. FIG. 9 schematically shows the planar Josephson junction device.

Figure 10:
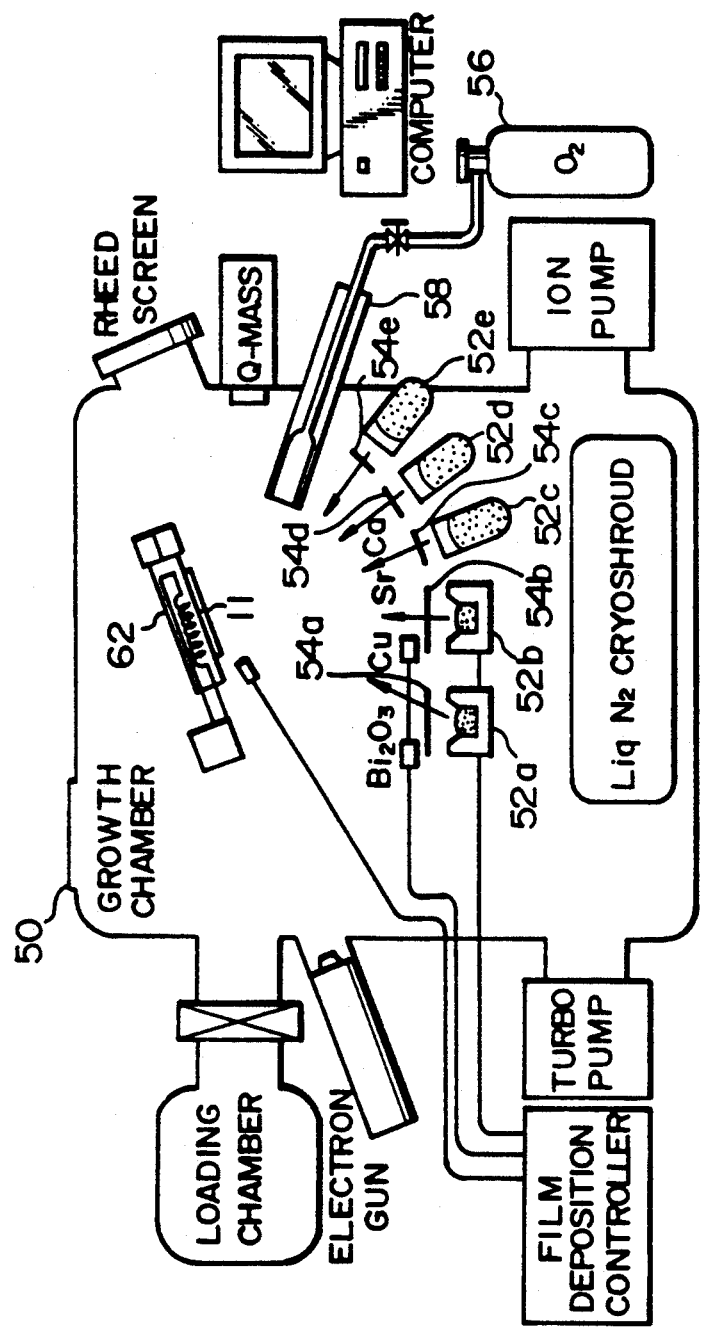
FIG. 10 is an explanatory view of the structure of a molecular beam epitaxial apparatus.

FIG. 10 schematically shows a thin-film producing apparatus using a molecular beam epitaxial apparatus. In FIG. 10, a vacuum chamber 50 has two electron beam evaporation sources 52a, 52b and three crucible evaporation sources 52c to 52e utilizing ohmic-resistance heating. Bismuth oxide $Bi_2O_3$, strontium Sr, calcium Ca, copper Cu and the like are ejected from these evaporation sources 52a to 52e independently of each other in the form of atoms or molecules. The ejection of these atoms is controlled by shutters 54a to 54e which are provided in correspondence with the respective evaporation sources 52a to 52e. The vacuum chamber 50 is provided with a radical beam source 58 which is connected to an oxygen bomb 56, and the oxygen from the oxygen bomb 56 m in the form of molecules is supplied in the form of atomic oxygen O* and the radical beam thereof is projected onto the substrate 11. The substrate 11 is fixed to a substrate holder 62 which is disposed at the opposite position to the evaporation sources 52 in the vacuum chamber 50. In this way, it is possible to form a desired thin film on the substrate 11. Although MgO is used for the substrate 11 in this embodiment, $SrTiO_3$, YSZ, $Al_2O_3$, $LaAlO_3$, $LaGaO_3$ and $NdGaO_3$ are also usable.

An oxide thin film 18 was first formed on the MgO substrate 11 by such a thin-film producing apparatus. $Bi_2O_3$, Sr, Cu and atomic oxygen O* were irradiated in the heated MgO substrate 11, thereby forming a Bi-Sr-Cu-O thin film. The temperature of the substrate was 650° to 750° C. $Bi_2O_3$, Sr and Cu were serially and repeatedly deposited in the order of Bi, Sr, Cu, Sr, Bi. The evaporation rates of $Bi_2O_3$, Sr, Cu and O* were about 1.25 Å/sec, 2.20 Å/sec, 0.40 Å/sec and $1 \times 10^{16}$/sec. $cm^2$, respectively. The opening times for $Bi_2O_3$, Sr, and Cu (the time during which the shutter is open) were 3.20 seconds, 4.02 seconds and 2.90 seconds, respectively.

Although the atomic oxygen O* was irradiated simultaneously with $Bi_2O_3$, Sr and Cu in this embodiment, it may be implanted every time after the deposition of each of Bi, Sr, Cu, Sr, Bi.

A Bi-Sr-Ca-Cu-O thin film, which is the superconducting thin film 12 was then formed by irradiating $Bi_2O_3$, Sr, Ca, Cu and atomic oxygen O* in the same way as in the formation of the oxide thin film 18. The temperature of the substrate was 650° to 750° C. $Bi_2O_3$, Sr, Ca and Cu were serially and repeatedly deposited in the order of Bi, Sr, Ca, Cu, Ca, Sr, Bi. The evaporation rates of $Bi_2O_3$, Sr, Ca, Cu and O* were about 1.25 Å/sec, 2.20 Å/sec, 2.20 Å/sec, 0.40 Å/sec and $1 \times 10^{16}$/sec. $cm^2$, respectively. The opening times for $Bi_2O_3$, Sr, Ca and Cu (the time during which the shutter is open) were 3.20 seconds, 4.02 seconds, 3.85 seconds and 2.90 seconds, respectively. Although the atomic oxygen O* was irradiated simultaneously with $Bi_2O_3$, Sr, Ca, Cu in this embodiment, it may be irradiated ever time after the deposition of each of Bi, Sr, Cu, Ca, Cu, Sr, Bi.

The thickness of the Bi-Sr-Cu-O thin film was 1,500 Å in this embodiment, but it is not limited thereto so long as it is not less than 300 Å. Although the thickness of the Bi-Sr-Ca-Cu-O thin film was 1,500 Å in this embodiment, it may be selected from the range of 500 to 2,000 Å.

The damaged layer 14 was then formed by irradiating the superconducting thin film 12 situated on the surface of the bilayer film with focused ion beams of Si at an accelerating energy of 100 keV. Although Si ions were used in this embodiment, Au ions, Bi ions or else may be used in place of Si ions. The dosage of ions was $7 \times 10^{16}$ ions/$cm^2$ in this embodiment, but it may be selected from the range of $10^{16}$ to $10^{17}$ ions/$cm^2$. The accelerating voltage was 100 keV in this embodiment, but it may be varied in the range of 30 to 200 keV depending upon the thickness of the superconducting thin film.

The bilayer film was next immersed in an aqueous solution of 1-N KOH as an etchant at 25° C. for 5 minutes, and washed with pure water. Although the concentration of KOH was 1 N in this embodiment, it may be selected from the range of 1 to 10 N. KOH was used for an alkaline aqueous solution in this embodiment, but it may be replaced by NaOH, LiOH, RbOH, CsOH, $Ba(OH)_2$ or $Sr(OH)_2$. In this case, the concentration of the aqueous alkaline solution is 0.1 to 10 N.

Figure 11:
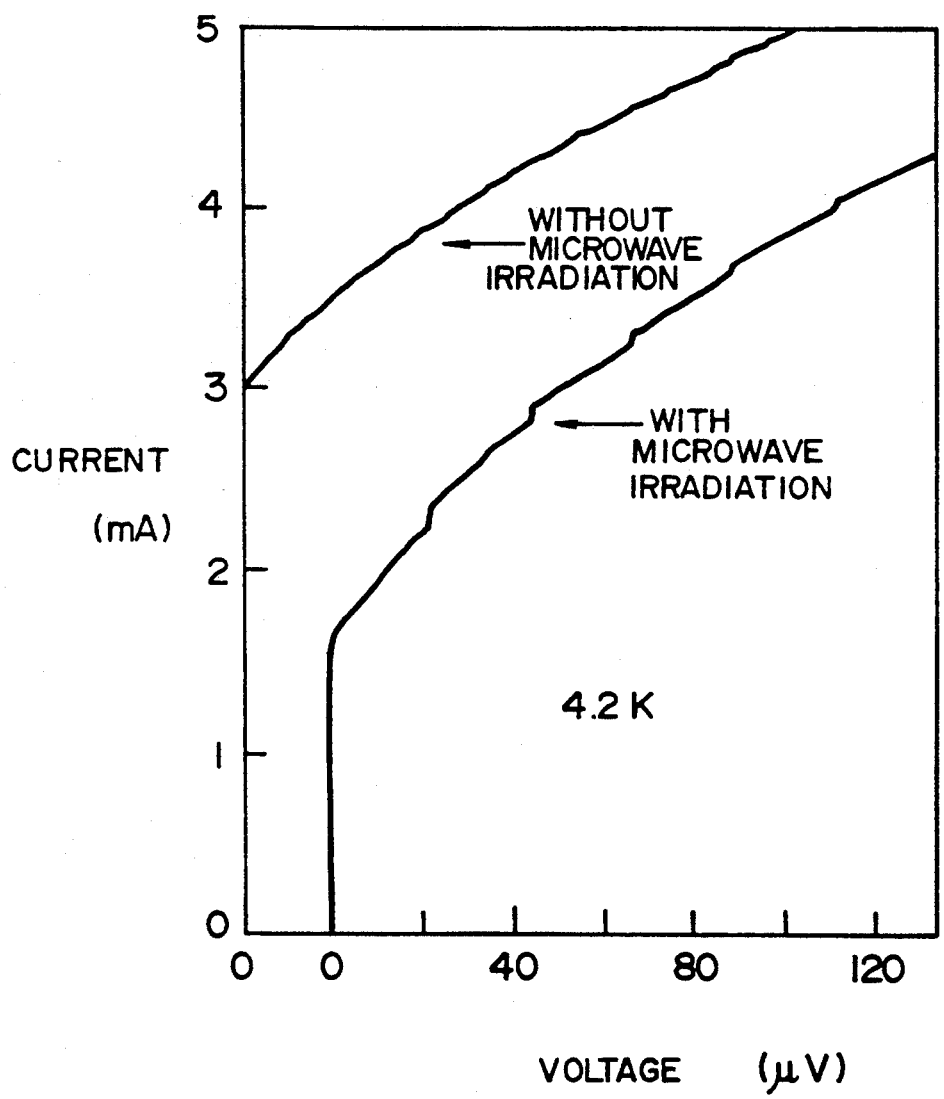
FIG. 11 shows the voltage/current characteristic of the embodiment of a Josephson junction device shown in FIG. 9.
Figure 12:
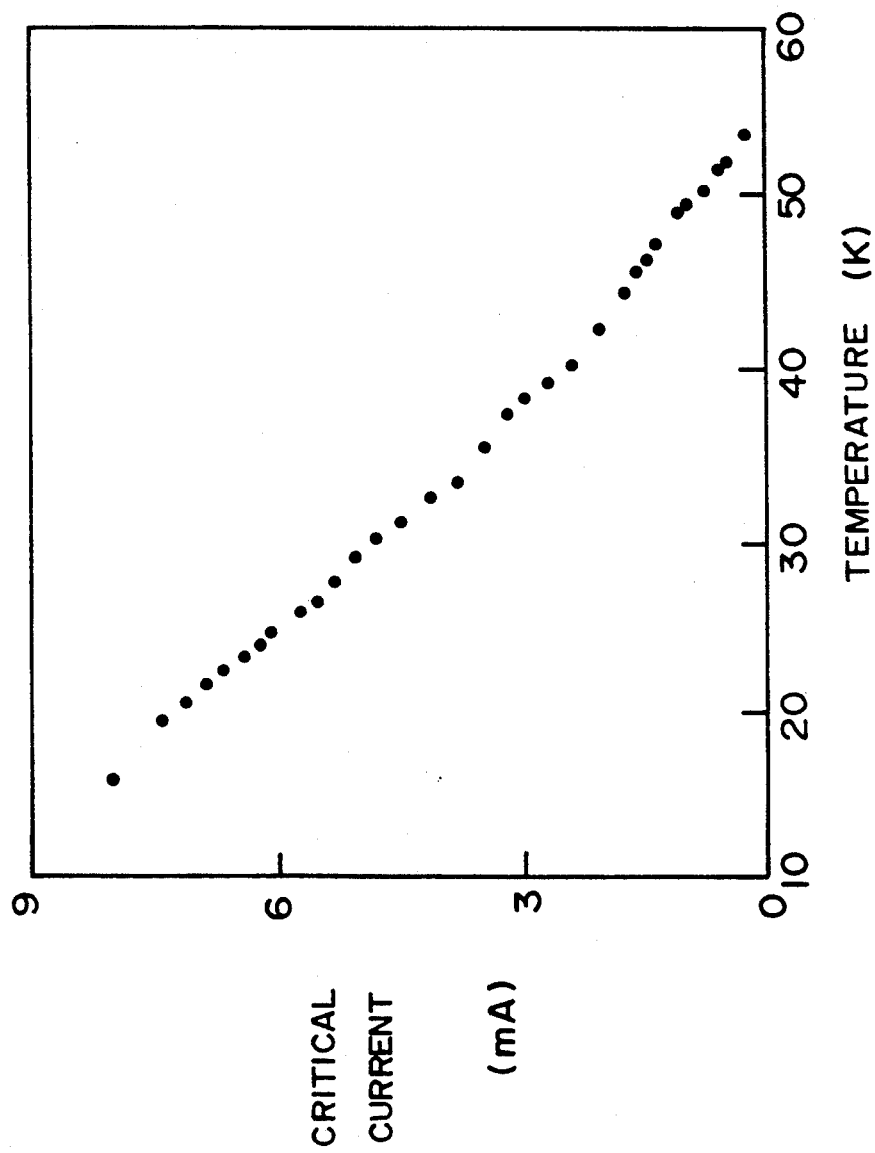
FIG. 12 is a characteristic curve showing the relationship between the temperature and the critical current of the embodiment of a Josephson junction device shown in FIG. 9.
Figure 13:
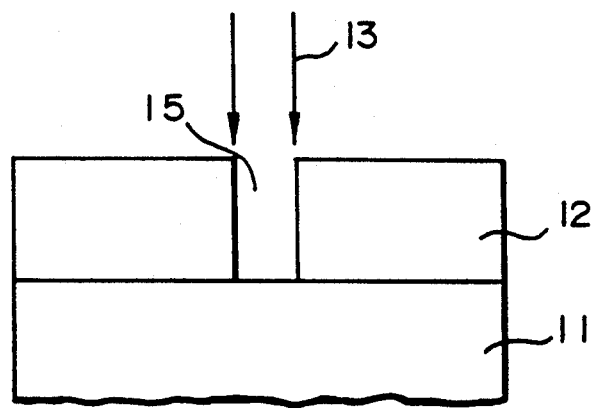
FIG. 13 is a schematic sectional view of an example of conventional ion beam sputter etching.
Figure 14A:
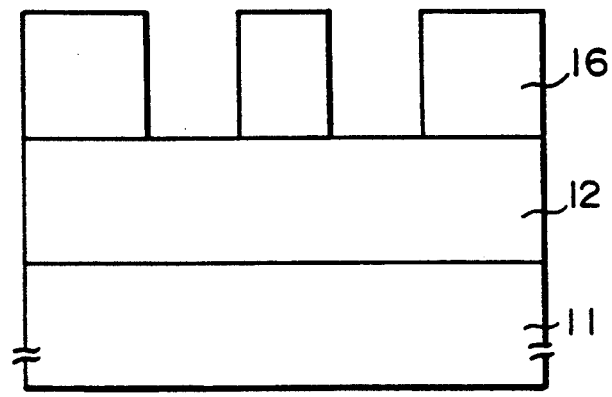
Figure 14B:
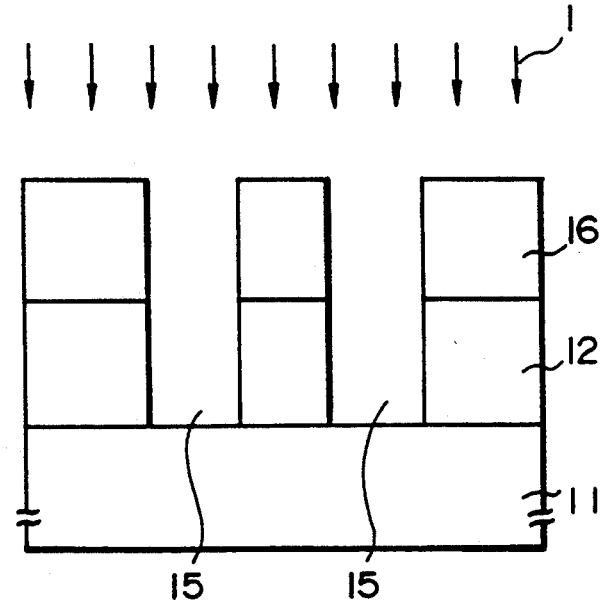
Figure 14C:
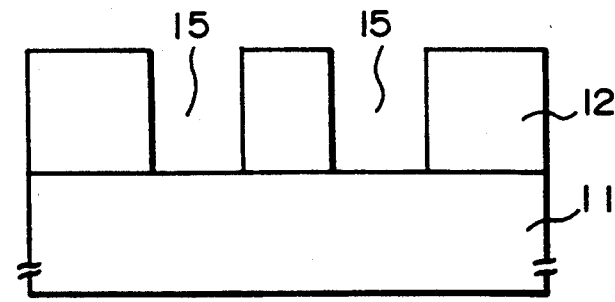
Figure 15:
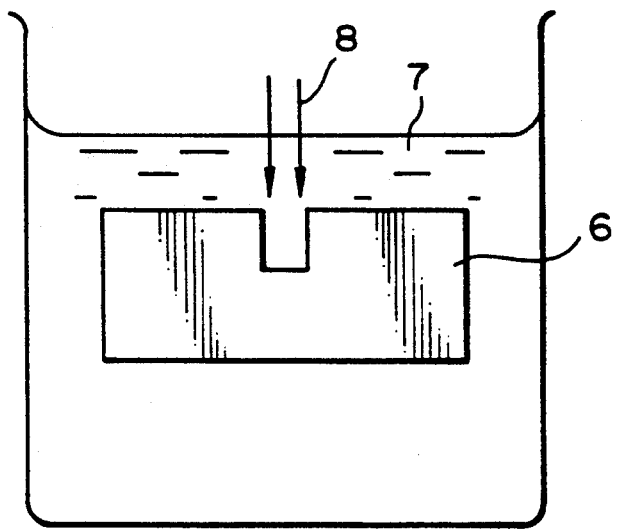
FIG. 15 is an explanatory view of conventional laser assisted etching.

FIG. 11 shows the current-voltage curve at 4.2 K of the junction device obtained in the above-described way. Since Shapiro steps were observed in the junction device irradiated with a microwave, the junction device proved to be a Josephson junction device. These steps indicate that the damaged layer formed on the Bi-Sr-Ca-Cu-O thin film by the irradiation by the ion beams has been removed by the KOH treatment. FIG. 12 shows the relationship between the critical current and temperature of the junction device obtained in accordance with the present invention. From this linear graph, the device is proved to be a microbridge junction device.

In this way, a planar Josephson junction device is obtained in this embodiment.

Although the Bi-based superconductor was used as the oxide superconductor in this, a Y (rare earth) or Ti-based oxide superconductor may be used instead. Bi-Sr-Cu-O used as the oxide in this embodiment may be replaced by $PrBa_2Cu_3O_{7-x}$, $Bi_2Sr_2MO_6$ (M represents Co, Mn or Fe), $SrTiO_3$, a superlattice of Bi-Sr-Cu-O and Bi-Sr-Ca-Cu-O, or a superlattice of a Y-based superconductor and $Pr-Ba_2Cu_3O_{7-x}$.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A method of processing an oxide superconducting film comprising the steps of: forming a damaged layer by irradiating said oxide superconducting film with ion beams; and removing the damaged layer by treatment with an aqueous alkaline solution.

2. A method according to claim 1, wherein the ion beams used at the step of forming the damaged layer are focused ion beams generated by a focused ion beam method.

3. A method according to claim 2, wherein the superconducting film contains bismuth and the ion beams are $Si^{++}$ ion beams.

4. A method according to claim 2, wherein the superconducting film contains bismuth and the ion beams are Au ion beams.

5. A method according to claim 1, wherein the step of forming the damaged layer includes the steps of: forming a resist layer provided with holes on the surface of the superconducting thin film; and implanting ions in the entire part of the surface from above.

6. A method according to claim 5 wherein the superconducting film contains bismuth and the ion beams are $Si^{++}$ ion beams.

7. A method according to claim 5, wherein the superconducting film contains bismuth and the ion beams are Au ion beams.

8. A method of producing a Josephson junction device comprising the steps of:

forming an oxide film on a substrate;

forming an oxide superconducting film on the oxide film;

forming a damaged layer by irradiating the superconducting film; and removing the damaged layer by treatment with an aqueous alkaline solution.

9. A method according to claim 8, wherein the constituent elements of the oxide thin film constitute a part of the constituent elements of the superconducting thin film.

10. A method according to claim 9, wherein the superconducting film contains bismuth and the ion beams are $Si^{++}$ ion beams.

11. A method according to claim 9, wherein the superconducting film contains bismuth and the ion beams are Au ion beams.

* * * * *